United States Patent
Koike-Akino

(10) Patent No.: US 9,722,633 B2
(45) Date of Patent: Aug. 1, 2017

(54) METHOD AND SYSTEM FOR RELIABLE DATA COMMUNICATIONS WITH ADAPTIVE MULTI-DIMENSIONAL MODULATIONS FOR VARIABLE-ITERATION DECODING

(71) Applicant: Mitsubishi Electric Research Laboratories, Inc., Cambridge, MA (US)

(72) Inventor: Toshiaki Koike-Akino, Malden, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 14/619,392

(22) Filed: Feb. 11, 2015

(65) Prior Publication Data
US 2016/0233979 A1      Aug. 11, 2016

(51) Int. Cl.
*H03M 13/00* (2006.01)
*H03M 13/11* (2006.01)
(Continued)

(52) U.S. Cl.
CPC ....... *H03M 13/116* (2013.01); *H03M 13/036* (2013.01); *H03M 13/1102* (2013.01);
(Continued)

(58) Field of Classification Search
None
See application file for complete search history.

(56) References Cited

U.S. PATENT DOCUMENTS

| | | | |
|---|---|---|---|
| 7,216,283 B2 | 5/2007 | Shen et al. | |
| 7,685,494 B1 * | 3/2010 | Varnica | H03M 13/033 714/752 |

(Continued)

FOREIGN PATENT DOCUMENTS

| | | |
|---|---|---|
| JP | 20140017102 A1 | 1/2014 |
| WO | 2014017102 A1 | 1/2014 |

OTHER PUBLICATIONS

Brink et al., "Design of low-density parity-check codes for modulation and detection," IEEE Transactions on Communications, vol. 52, No. 4, pp. 670-678, Apr. 2004.
(Continued)

*Primary Examiner* — Daniel McMahon
(74) *Attorney, Agent, or Firm* — Gene Vinokur; James McAleenan; Hironori Tsukamoto

(57) ABSTRACT

In an advanced adaptive modulation and coding (AMC) scheme, the code rate and the parity-check matrix (PCM) for low-density parity-check (LDPC) codes are adapted according to modulation formats and variable-iteration receivers. The degree distribution for the PCM adaptation is designed by heuristic optimization to minimize the required SNR via an extrinsic information transfer (EXIT) trajectory analysis for finite-iteration decoding. The method uses dynamic window decoding by generating spatially coupled PCM for quasi-cyclic LDPC convolutional coding. The method also provides a way to jointly optimize labeling and decoding complexity for high-order and high-dimensional modulations.

15 Claims, 10 Drawing Sheets

(51) Int. Cl.

| | |
|---|---|
| H03M 13/21 | (2006.01) |
| H03M 13/25 | (2006.01) |
| H03M 13/35 | (2006.01) |
| H03M 13/03 | (2006.01) |
| H04L 1/18 | (2006.01) |
| H03M 13/13 | (2006.01) |
| H03M 13/15 | (2006.01) |
| H03M 13/19 | (2006.01) |
| H04L 1/00 | (2006.01) |

(52) U.S. Cl.
CPC .... *H03M 13/1111* (2013.01); *H03M 13/1154* (2013.01); *H03M 13/1191* (2013.01); *H03M 13/21* (2013.01); *H03M 13/251* (2013.01); *H03M 13/255* (2013.01); *H03M 13/353* (2013.01); *H03M 13/616* (2013.01); *H03M 13/6325* (2013.01); *H03M 13/6516* (2013.01); *H04L 1/0026* (2013.01); *H04L 1/0035* (2013.01); *H04L 1/1829* (2013.01); *H03M 13/136* (2013.01); *H03M 13/138* (2013.01); *H03M 13/1505* (2013.01); *H03M 13/19* (2013.01); *H04L 1/0003* (2013.01); *H04L 1/0009* (2013.01)

(56) References Cited

U.S. PATENT DOCUMENTS

| | | | |
|---|---|---|---|
| 8,301,965 B2 | 10/2012 | Wu et al. | |
| 8,656,244 B1 | 2/2014 | Chang | |
| 2004/0071158 A1 | 4/2004 | Wei et al. | |
| 2005/0283707 A1* | 12/2005 | Sharon | H03M 13/1137 714/758 |
| 2005/0283708 A1* | 12/2005 | Kyung | H03M 13/1111 714/758 |
| 2006/0190801 A1* | 8/2006 | Shin | H03M 13/1197 714/758 |
| 2007/0162822 A1* | 7/2007 | Choi | H03M 13/116 714/758 |
| 2008/0037676 A1 | 2/2008 | Kyung et al. | |
| 2008/0256425 A1* | 10/2008 | Oh | H03M 13/1185 714/801 |
| 2008/0294963 A1* | 11/2008 | Hwang | H03M 13/036 714/755 |
| 2010/0162078 A1 | 6/2010 | Miller et al. | |
| 2010/0325511 A1* | 12/2010 | Oh | H03M 13/116 714/752 |
| 2011/0307756 A1* | 12/2011 | Nguyen | H03M 13/036 714/752 |
| 2012/0269294 A1 | 10/2012 | Zheng et al. | |
| 2013/0139024 A1 | 5/2013 | Nguyen et al. | |
| 2014/0068385 A1 | 3/2014 | Zhang et al. | |
| 2014/0133848 A1 | 5/2014 | Koike-Akino et al. | |

OTHER PUBLICATIONS

Hu et al., "Regular and irregular progressive edge-growth tanner graphs," IEEE Transactions on Information Theory, vol. 51, No. 1, pp. 386-396, Jan. 2005.

Fischer et al. "Bandwith-Variable Transceivers based on Four-Dimensional Modulation Formats," Journal of Lightwave Technology, IEEE Service Center, New York, NY, US, vol. 32, No. 16, Aug. 15, 2014, pp. 2886-2895. XP011554205.

Lin et al. "Constant-power adaptive orthogonally multiplexed modulations under flat Rayleigh fading," IWWW Transactions on Wireless Communications, IEEE Piscataway, NJ, US. vol. 7, No. 5, May 2008. pp. 1517-1521. XP011227189.

Fischer et al. "Bandwidth Variable Transceivers based on Four Dimensional Modulation Formats." Journal of Lightwave Technology, IEEE. vol. 32, No. 16. Aug. 15, 2014. pp. 2886-2895.

Seok-Ki Ahn et al. "Adaptive Modulation and Coding Schemes Based on LDPC Codes with Irregular Modulation," IEEE Transactions on Communications, IEEE . vol. 58, No. 9, Sep. 2010. pp. 2465-2470.

Dimnik et al. "Improved Random Redundant Iterative HDPC Decoding," IEEE Transactions on Communications, IEEE. vol. 57, No. 7, Jul. 2009. pp. 1982-1985.

Lin et al. "Constant Power Adaptive Orthogonally Multiplexed Modulations under Flat Rayleigh Fading." IEEE Transactions on Wireless Communications,IEEE vol. 7, No. 5, May 2008. pp. 1517-1521.

Hehn et al. "Improved Iterative Decoding of the LDPC Codes from the IEEE WiMAX Standard," Source and Channeling Coding, 2010, IEEE. Jan. 18, 2010. pp. 1-6.

* cited by examiner

| Decoding Iteration | R=1/2 Variable Degree | RSNR (dB) | R=2/3 Variable Degree | RSNR (dB) | R=3/4 Variable Degree | RSNR (dB) | R=4/5 Variable Degree | RSNR (dB) | R=9/10 Variable Degree | RSNR (dB) |
|---|---|---|---|---|---|---|---|---|---|---|
| 2 | $0.99x^{10}+0.01x^{12}$ | 8.08 | $0.99x^9+0.01x^{11}$ | 8.60 | $1.00x^9$ | 8.92 | $0.85x^{10}+0.15x^{11}$ | 9.12 | $0.75x^3+0.25x^4$ | 10.64 |
| 4 | $1.00x^6$ | 4.69 | $1.00x^6$ | 5.65 | $1.00x^5$ | 6.26 | $0.51x^5+0.49x^6$ | 6.65 | $0.75x^3+0.25x^4$ | 8.27 |
| 8 | $1.00x^4$ | 2.67 | $0.99x^4+0.01x^6$ | 4.08 | $0.99x^4+0.01x^5$ | 4.86 | $1.00x^4$ | 5.39 | $0.75x^3+0.25x^4$ | 6.91 |
| 16 | $0.67x^3+0.33x^{14}$ | 1.55 | $0.51x^3+0.07x^4+0.42x^{16}$ | 3.26 | $0.47x^2+0.09x^4+0.44x^{16}$ | 4.18 | $0.43x^2+0.12x^4+0.45x^{16}$ | 4.78 | $0.75x^3+0.25x^4$ | 6.38 |
| 32 | $0.07x^2+0.50x^3+0.43x^{16}$ | 0.92 | $0.04x^2+0.49x^3+0.47x^{16}$ | 2.81 | $0.03x^2+0.48x^3+0.49x^{16}$ | 3.81 | $0.03x^2+0.46x^3+0.51x^{16}$ | 4.45 | $0.1x^2+0.62x^3+0.28x^5$ | 6.20 |
| Infinity | $0.21x^2+0.33x^3+0.46x^{12}$ | 0.36 | $0.17x^2+0.33x^3+0.50x^{12}$ | 2.45 | $0.16x^2+0.31x^3+0.53x^{12}$ | 3.52 | $0.15x^2+0.31x^3+0.54x^{12}$ | 4.20 | $0.12x^2+0.32x^3+0.56x^{13}$ | 5.85 |

| Modulation Dimension | R=9/10 | |
|---|---|---|
| | Variable Degree | RSNR (dB) |
| 2D BPSK | $0.31x^2 + 0.69x^3$ | 4.35 |
| 4D Simplex | $0.31x^2 + 0.69x^3$ | 3.74 |
| 8D Extended Hamming | $0.31x^2 + 0.69x^3$ | 2.73 |
| 16D Nordstrom-Robinson | $0.73x^2 + 0.26x^{14} + 0.01x^{16}$ | 0.84 |
| 24D Extended Golay | $0.74x^2 + 0.26x^{13}$ | 0.69 |
| ⋮ | ⋮ | ⋮ |

METHOD AND SYSTEM FOR RELIABLE DATA COMMUNICATIONS WITH ADAPTIVE MULTI-DIMENSIONAL MODULATIONS FOR VARIABLE-ITERATION DECODING

FIELD OF THE INVENTION

This invention is related to error control coding for digital data communications, particularly for optical and radio communications systems.

BACKGROUND OF THE INVENTION

Low-density parity-check (LDPC) codes have been often used for error control codes in digital data communications including radio and optical communications networks because these codes achieve close to theoretical Shannon limit in practice. For those communications networks, LDPC-coded data are sent from a transmitter to a receiver over noisy channels. Using LDPC codes with an appropriate code rate, potential errors caused by channel noise can be efficiently corrected by an LDPC decoder at the receiver. To achieve better performance depending on the channel quality, an adaptive modulation and coding (AMC) has been used. The AMC uses different pairs of modulation order and code rate depending on the channel quality. For example, depending on a signal-to-noise ratio (SNR) at the receiver, the transmitter changes the modulation format, e.g., from 4-ary quadrature-amplitude modulation (QAM) to 16-ary QAM, and the code rate of the LDPC codes, e.g., from 0.5 to 0.9. By adaptively choosing the modulation order and the code rate, the AMC can achieve the maximum possible data rate close to Shannon limit over all the SNR regimes.

Typically, a degree distribution of LDPC codes determines a bit-error rate (BER) performance of the LDPC decoder. However, one optimized degree distribution of irregular LDPC code at a certain condition is not always best for other conditions even when the channel quality is constant. For example, the best code for 4 QAM may be no longer the best for 16 QAM. Therefore, the conventional AMC with the rate adaptation does not resolve this problem because the AMC does not provide multiple LDPC codes having the same code rate.

Recently, high-dimensional modulation (HDM) formats, such as polarization-switched quadrature phase-shift keying (PS-QPSK) and set-partitioned 128 QAM, have been used for reliable data transmissions, especially for coherent optical communications. Those modulation formats can provide a larger squared Euclidean distance, and the BER performance can be improved especially in uncoded networks. However, there is no obvious way to optimize LDPC codes for high-order and high-dimensional modulations. For example, one LDPC code optimized for 4-dimensional modulation format cannot be optimal for 8-dimensional modulation formats.

Some networks use bit-interleaved coded-modulations (BICM) and its iterative demodulation (ID) variant (called BICM-ID) for high-order modulation formats. Another way includes multi-layer coding (MLC), which uses multiple LDPC codes for different significant bits in high-order modulation formats. BICM is the simplest and optimizing LDPC codes for BICM does not depend on modulation formats, while the performance depends on labeling. BICM-ID outperforms BICM, and approaches the MLC performance bound. However, BICM-ID requires a higher latency because soft-decision information needs to be fed back to a demodulator from the decoder. Although MLC performs the best in theory, it has a drawback of codeword length shortening for each layered codes. In addition, there is no good way to design LDPC codes for HDM formats.

The performance of LDPC codes can be analyzed by an extrinsic information transfer (EXIT) chart or density evolution (DE). Those methods are also used for designing a degree distribution of irregular LDPC codes, for example, by linear programing for curve fitting. Although a good degree distribution can be designed with EXIT or DE, those methods assume infinite codeword length, infinite precision, and infinite number of iterations for decoding. Therefore, sometimes the expected performance cannot be obtained in practical use, where there exist some limitations in size of memory, bit width for precision, and maximum number of iterations.

Accordingly, there is a need in the art for an approach in designing practical LDPC codes to support various high-order and high-dimensional modulation formats in high-speed communications networks accounting for the trade-off between performance and complexity.

SUMMARY OF THE INVENTION

The problem to adapt data rates by changing modulation order and code rate in conventional adaptive modulation and coding (AMC) networks is dealt with by this invention with parity-check matrix (PCM) adaptation for finite-iteration decoders and any modulation formats. The conventional AMC uses multiple LDPC codes having different code rates, and multiple modulation formats having different modulation orders to control a total data rate depending on channel quality such as signal-to-noise ratio (SNR).

Some important features of the invention include that the PCM design method considers any order and any dimension for modulation formats, and any iteration number for decoding and demodulation. The advantage over the conventional AMC solutions is the fact that high-performance decoding is possible for any modulation formats and any practical decoders by adapting not only the code rate but also the PCM. At the same time, the decoder can use the best code and modulation while computational complexity and power consumption can be minimized.

The network of the invention uses multiple LDPC codes, which have different PCMs even for the same code rate, and the best LDPC code is adaptively selected to use at the transmitter depending on the modulation format and the receiver behavior as well as the channel quality. For example, when the receiver reduces the maximum number of iterations for lower-power decoding, a different LDPC code is selected even though the channel quality such as the SNR does not change.

For another example, depending on whether or not the receiver uses iterative demodulation (ID) to improve performance of high-dimensional modulation (HDM), a different LDPC code is selected. In addition to the conventional code rate adaptation, the network adapts PCM, whose degree distribution is pre-designed for different modulations and different number of iterations by an extrinsic information transfer (EXIT) chart analysis.

The method of the invention provides a way to adjust a degree distribution of PCM depending on different conditions. The decoder performance is improved by changing the degree distribution while the mutual information updates are tracked over iteration. The design method can consider different HDM formats, different number of iterations, different number of demodulations, different decoding algorithms, different bit widths, and different codeword lengths.

In one embodiment, the receiver adaptively changes the PCM, which is linearly dependent on the original PCM of one LDPC code. The adaptive PCM simplifies the transmitter as this embodiment can keep using the same LDPC code (or fewer number of codes) regardless of modulation formats, decoding methods, and channel quality. This embodiment provides a way to adjust the degree distribution of original PCM by semi-random linear transformation by a modular perturbation matrix to achieve best possible decoder performance.

In yet another embodiment, the PCM is changed over different iteration count at the decoder to accelerate convergence of decoding speed. The different PCMs, which are linearly dependent, are pre-designed by EXIT chart trajectory analysis to improve convergence speed for low-power and high-throughput decoding.

In one embodiment, the network uses spatially coupled LDPC codes and nonbinary LDPC codes. To decode without high latency, the method of the invention provides a way to use dynamic window decoding by generating spatially coupled PCM. To solve the problem of latency of BICM-ID and codeword length shortening of MLC, the methods of the invention optimize labeling for nonbinary LDPC codes to provide a coded modulation scheme referred to as nonbinary input coded modulation (NBICM).

BRIEF DESCRIPTION OF THE DRAWINGS

FIG. 5 is a table example of degree distributions designed for iteration-dependent PCM adaptation according to some embodiments of the invention;

FIG. 7 is a table example of degree distributions designed for modulation-dependent PCM adaptation according to some embodiments of the invention;

DETAILED DESCRIPTION OF THE PREFERRED EMBODIMENTS

Figure 1:
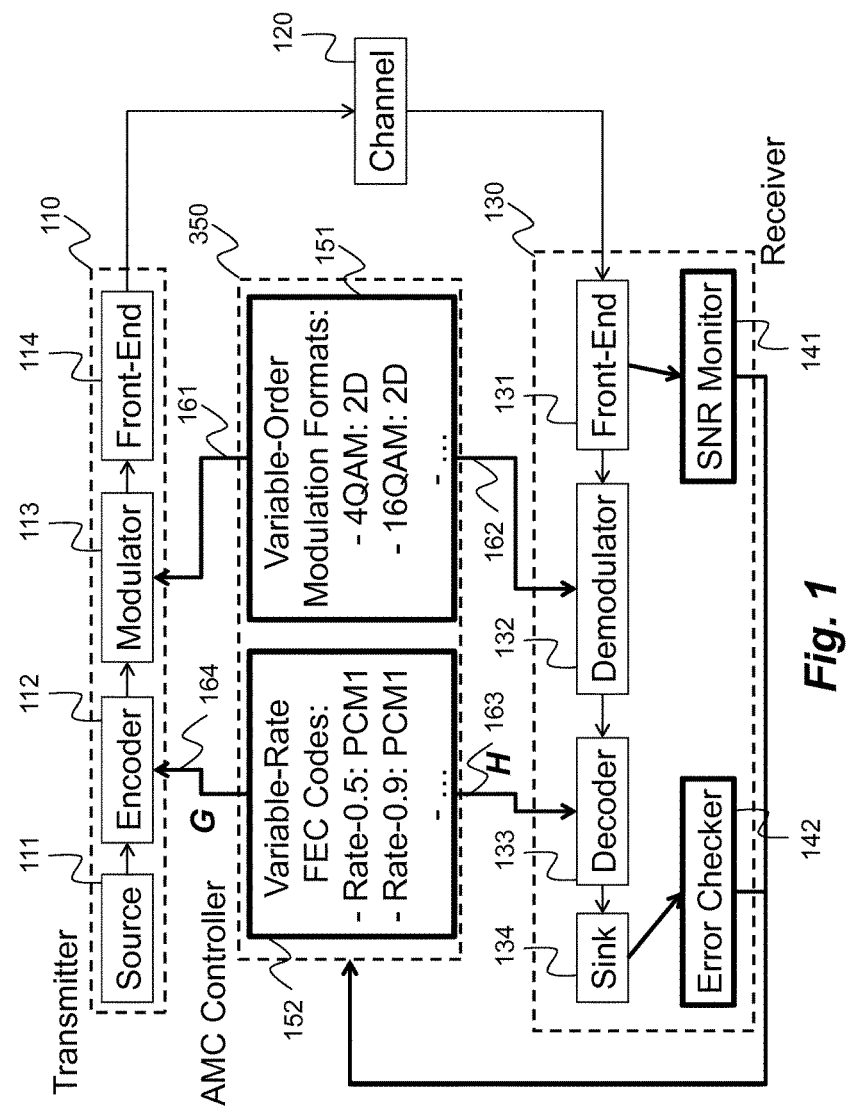
FIG. 1 is a block diagram of a network for transmitting digital data with adaptive modulation and coding (AMC) using principles employed by some embodiments of the invention.

FIG. 1 shows a network to transmit digital data from a transmitter 110 to a receiver 130 over communications channel 120 with an adaptive modulation and coding (AMC) controller 150 using principles employed by some embodiments of the invention. The communications channel 120 includes, e.g., fiber for optical communications, free space for visible light communications, air for radio communications, water for acoustic communications, coaxial cable for power line communications, and so on.

At the transmitter 110, the digital data coming from a source 111 are encoded by an encoder 112 into coded words by a forward error correction (FEC) code, e.g., such as a low-density parity-check (LDPC) code. For such linear codes, the digital data s of a length N−M are multiplied arithmetically by a generator matrix G 164 of a size N-by-(N−M), which appends parity-check data p of a size M for the receiver 130 to correct potential errors. The code rate is defined by R=1−M/N. The coded words c are expressed as c=Gs over the Galois field or the Lie ring. The coded words are then modulated by a modulator 113 in a format, such as binary phase-shift keying (BPSK), 16-ary quadrature-amplitude modulation (16 QAM), and so on. The modulated data are expressed as x=M[c], where M[.] denotes a modulation format 161 to generate complex-valued signal constellations from the coded words. The modulated data x are transmitted into the channel 120 through an analog front-end 114, e.g., such as an electro-optic circuit with a laser source and a radio-frequency circuit with a transmitting antenna. The front-end 114 can include other digital/analog pre-processing, e.g., such as pre-equalization, pre-coding, filtering, etc. For example, a root-raised-cosine filter is used as a low-pass filter. The transmitter 110 uses some memory storages and at least one processor for transmitting the modulated data.

The receiver 130 obtains noisy modulated data through the channel 120 and an analog front-end 131, e.g., such as an opto-electric circuit. The front-end 131 can include other digital/analog pre-processing, such as equalization, filtering, timing recovery, carrier phase recovery, etc. The noisy modulated data received after pre-processing at the front-end 131 are expressed as y=x+z, where z is a sequence of additive noise of variance $\sigma^2$. The noisy modulated data y are demodulated by a demodulator 132, and decoded by a decoder 133 to recover the original digital data. The demodulator 132 uses the modulation format M[.] 162, which is identical to the one 161 used in the modulator 113 at the transmitter 110. The demodulator 132 calculates likelihoods based on the squared Euclidean distance for all the possible constellations, and provides log-likelihood ratios (LLR) based on the maximum a posteriori probability (MAP) estimation for the decoder 133. As an example, the decoder 133 employs an iterative belief propagation algorithm for message passing over a sparse graph represented by a parity-check matrix (PCM) H 163 of a size M-by-N, which is an arithmetically orthogonal compliment of the generator matrix such that HG=0 holds over the Galois field or the Lie ring. The belief propagation algorithm can correct potential errors occurred through the data communications. The decoder provides decoded data as an estimate of the original digital data sent from the data source 111. The decoded data are sent to a data sink 134. The receiver 130 uses some memory storages and at least one processer for recovering the digital data.

The generator matrix G, the modulation format M[.], and the PCM H are adaptively selected by the AMC controller 150. The AMC controller 150 uses some memory storages to store a set of modulation formats and FEC codes, and at least one processer. In one embodiment, the AMC controller 150 can work remotely at an external base station. In another embodiment, the AMC controller 150 is embedded at either the transmitter 110 or the receiver 130. It does not matter where it is, as long as the transmitter can use the selected modulation format and the selected generator matrix, and the receiver can use the selected modulation format and the selected parity-check matrices.

The AMC controller 150 selects one best modulation format from a finite set of variable-order modulation formats 151, together with one best FEC code from a finite set of variable-rate FEC codes 152, depending on the channel quality, e.g., such as signal-to-noise ratio (SNR) measured by an SNR monitor 141 or bit-error counts measured by an error checker 142.

Figure 2:
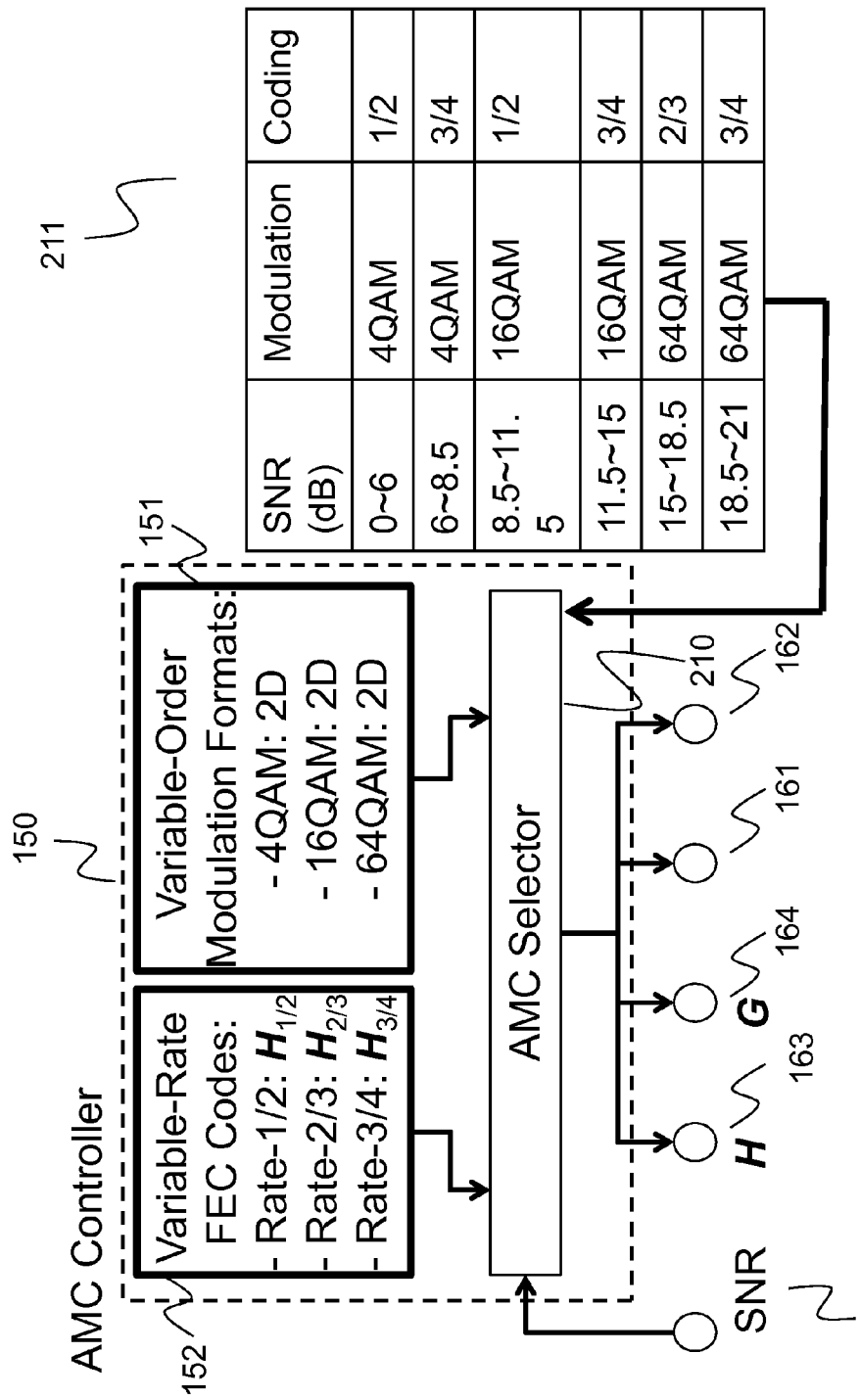
FIG. 2 is a block diagram of a prior art AMC controller.

FIG. 2 shows a non-limiting example of a block diagram of the conventional AMC controller 150. The AMC controller 150 uses a finite set of FEC codes 152, having different code rates. For example, the set 152 comprises three codes, whose code rates R are ½, ⅔, and ¾. Each code has corresponding PCM ($H_{1/2}$, $H_{2/3}$, and $H_{3/4}$) and generator matrix ($G_{1/2}$, $G_{2/3}$, and $G_{3/4}$). The AMC controller 150 uses another finite set of modulation formats 151, having different modulation orders. For example, the set 151 comprises three modulation formats of 4 QAM, 16 QAM, and 64 QAM, wherein all modulation formats are 2-dimensional (2D) constellations using in-phase and quadrature components.

The AMC controller 150 uses the measured SNR value from the SNR monitor 141 to select the best pair of modulation and coding by an AMC selector 310. The AMC selector 310 uses a pre-defined selection rule table 211. For example, the selection rule 211 determines the modulation format and the code rate to be selected; 4 QAM with ½-rate code is chosen when the SNR is between 0 dB and 6 dB, 4 QAM with ¾-rate code is chosen when the SNR is between 6 dB and 8.5 dB, 16 QAM with ½-rate code is chosen when the SNR is between 8.5 dB and 11.5 dB, 16 QAM with ¾-rate code is chosen when the SNR is between 11.5 dB and 15 dB, 64 QAM with ⅔-rate code is chosen when the SNR is between 15 dB and 18.5 dB, and 64 QAM with ¾-rate code is chosen when the SNR is between 18.5 dB and 21 dB. By adaptively selecting the pair of modulation formats and code rates, the maximum possible data rate can be achieved under a certain bit-error rate (BER) target for a wide range of SNR regimes. The AMC selector 310 indicates the selected best PCM H 163, generator matrix G 164, and modulation format M[.] 161 and 162 for the transmitter 110 and the receiver 130.

Such a rate adaptation of the conventional AMC controller 150 works well for bit-interleaved coded modulation (BICM), in which any modulation order is treated as a unified binary-output data. However, such an adaptation of code rates has a limitation for some receivers, which employ adaptive iteration decoding and BICM iterative demodulation (BICM-ID). For example, a ½-rate LDPC code optimized for BPSK is no longer optimal for 16 QAM with BICM-ID.

Enhanced AMC with PCM and HDM Adaptation

Figure 3:
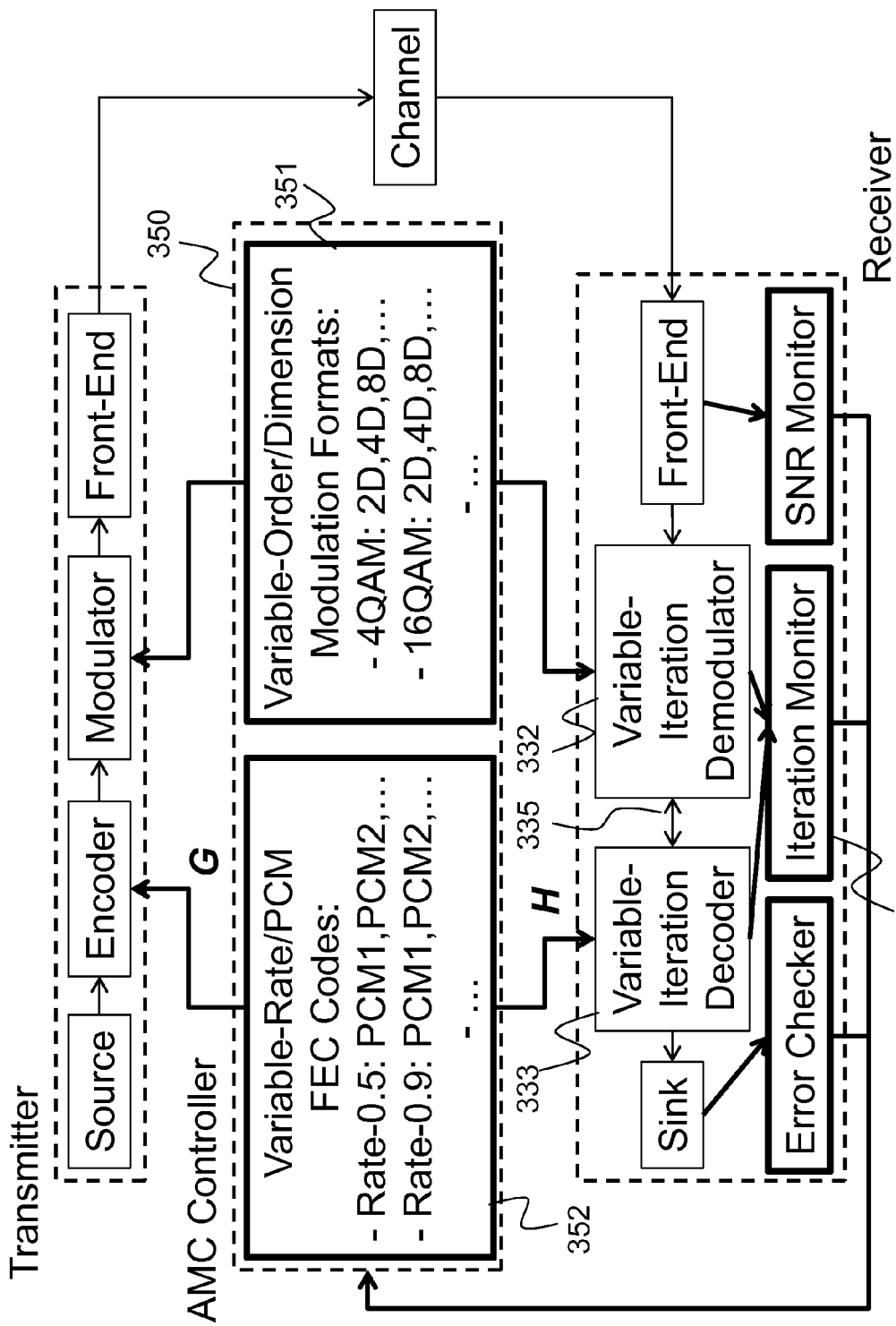
FIG. 3 is a block diagram of a network for transmitting digital data with enhanced AMC using high-dimensional modulation (HDM) and parity-check matrix (PCM) adaptation depending on iteration counts as well as channel quality according to some embodiments of the invention.

A schematic of the network and method according to some embodiments of the invention is shown in FIG. 3. These embodiments use an enhanced AMC controller 350 with a set of variable-PCM codes 352 in order to make full use of high-dimensional modulations (HDM) 351, a variable-iteration demodulator 332, and a variable-iteration decoder 333. The decoder 333 uses an adaptive number of iterations for belief propagation decoding. For example, the decoder uses at most 32 iterations when the BER performance needs to be improved at low SNR regimes, while the maximum number of iterations can be reduced when the receiver needs to save power consumption at high SNR regimes. In order to improve the BER performance, the decoded data can be fed back 335 to the demodulator for BICM-ID. The number of iterative demodulations is also adaptive so that the best tradeoff between the BER performance and the power consumption is maintained for various different requirements. The AMC selection rule can be based on the minimum required SNR, the maximum possible data rate, the maximum processer throughput, the minimum possible power consumption, and any combination of those metrics.

In these embodiments of the invention, the AMC controller 350 uses not only the channel quality based on the SNR monitor 141 but also the number of iteration counts for the decoder 333 and the demodulator 332 based on an iteration monitor 343, in order to select the best pair of modulation formats and FEC codes. The AMC controller uses an enhanced finite set of modulation formats 351, wherein the modulation formats have not only various modulation orders but also various dimensions to support HDM. For example, a BPSK alternative HDM includes 4D simplex modulation, 8D modulation based on the extended Hamming code, 16D modulation based on the Nordstrom-Robinson nonlinear code, and 24D modulation based on the extended Golay code, those of which achieve a larger minimum squared Euclidean distance than BPSK, respectively, by 1.25 dB, 3.01 dB, 4.77 dB, and 6.02 dB. For other modulation orders, set-partitioned HDM, block-coded HDM, sphere-cut lattice-packed HDM, unitary space-time modulation and so on can be used. The AMC controller 350 selects HDM depending on SNR, iteration counts, required BER performance, allowable complexity, and maximum power consumption, according to network demands.

In these embodiments of the invention, the AMC controller 350 also uses an enhanced finite set of FEC codes 352, wherein the FEC codes have not only various code rates but also various PCMs for each code rate. For example, one PCM of ½-rate LDPC code for BPSK is different from another PCM of ½-rate LDPC code for 16 QAM, depending on the number of decoding iterations and demodulation iterations at the receiver. In particular, this embodiment is effective for supporting various HDM formats using BICM-ID because one LDPC code designed for one modulation format does not offer the best performance for the other modulation formats.

While the conventional AMC network uses only the rate adaptation according to the channel quality, this embodiment of the invention uses PCM adaptation according to the receiver behavior as well as the channel quality. For example, when the receiver reduces the number of iterations for decoding and changes to use no iteration for demodulator to reduce power consumption, a different LDPC code, whose PCM is pre-designed for this receiver parameter setup, is used at the transmitter. For another example, when the transmitter uses higher dimensional modulation and the receiver uses iterative demodulation in order to achieve lower BER, a different LDPC code, whose PCM is pre-designed for this HDM and this receiver parameter setup, is selected. This PCM adaptation can provide better performance by 2 dB than the conventional AMC using the constant PCM because one of best LDPC codes for one receiver condition does not always perform well for different receiver parameter setups.

Adaptive LDPC Codes for Finite-Iteration Decoder

One embodiment uses different PCMs depending on the number of iterations for decoding and demodulation. The receiver may use a variable-iteration decoder, in which the maximum number of iterations is adaptive to adjust the decoder throughput and power consumption depending on the condition and demand. This invention is based on a realization that the best LDPC code depends on the number of iterations for decoding and demodulation. For example, one LDPC code designed for 32-iteration decoder does not perform well for 4-iteration decoder. In conventional networks, the LDPC code is typically designed for a sufficiently large or even infinite number of iterations by linear programming for curve fitting of an extrinsic information transfer (EXIT) chart in order to provide best possible performance for idealistic decoders. This embodiment of the invention takes the finite-iteration decoding into account for practical receivers. The LDPC code is designed by a method using a trajectory of mutual information update over decoder iterations in EXIT chart analysis, instead of using the curve fitting.

Figure 4:
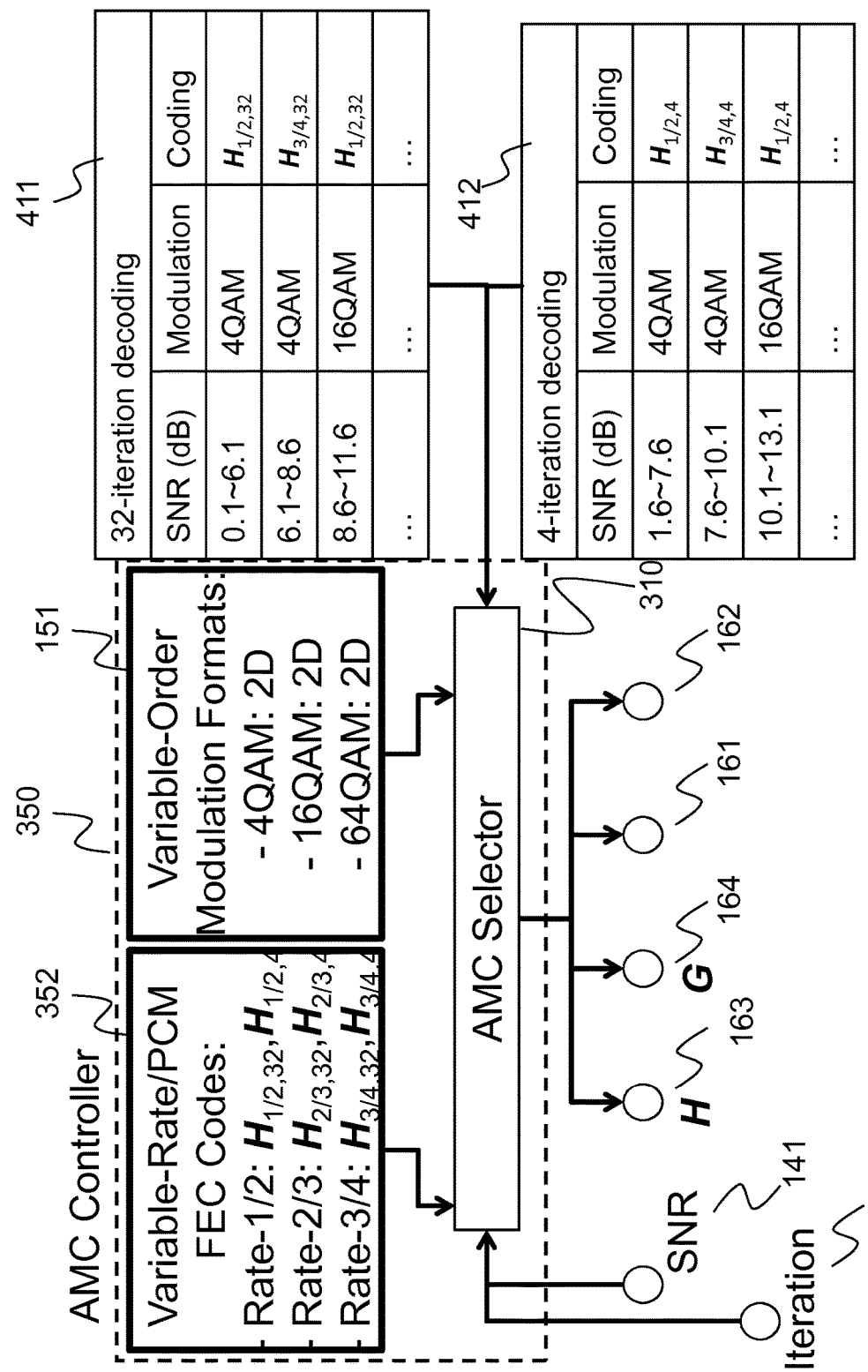
FIG. 4 is a block diagram of an AMC controller using iteration-dependent PCM adaptation according to some embodiments of the invention.

FIG. 4 shows a non-limiting example of the AMC controller using variable-rate and variable-PCM codes 352 according to one embodiment of the invention. This embodiment provides the best possible pair of the modulation format and FEC code for practical finite-iteration decoder, which may change the maximum number of iterations to adjust the power consumption and the BER performance. In this embodiment, the AMC controller 350 adaptively selects 310 the code rate and PCM from a finite set of FEC codes 352, depending on the maximum number of decoding iterations 343 as well as the measured SNR value 141. In this example, there are three different code rates of R=½, ⅔, and ¾, each of which has two different PCMs $H_{R,4}$ and $H_{R,32}$ for 4-iteration decoding and 32-iteration decoding, respectively. In addition to the modulation formats, the different PCMs, i.e., $H_{1/2,32}$, $H_{2/3,32}$, and $H_{3/4,32}$, are adaptively selected as a function of SNR for 32-iteration decoding, according to a selection rule table 411. And, another selection rule table 412 is used for 4-iteration decoding to adaptively select PCMs, i.e., $H_{1/2,4}$, $H_{2/3,4}$, and $H_{3/4,4}$, as well as the modulation format. The 32-iteration decoding offers better BER performance than 4-itertion decoding, while longer decoding latency and higher power consumption are required.

Since the BER performance of LDPC codes depends on the degree distribution of the PCM and the maximum number of iterations, the PCM $H_{R,4}$ has a different degree distribution compared to the PCM $H_{R,32}$ to provide the best BER performance for any iteration counts. The PCMs for LDPC codes are usually very sparse, i.e., the number of non-zero elements in the PCM is much smaller than the total number of elements. Any PCM has an equivalent representation by a bipartite graph, wherein each column, row, and non-zero element of the PCM are represented, respectively, by a variable node, a check node, and an edge connecting between one variable node and one check node. The number of edges connecting to one variable node is referred to as a variable node degree. The number of edges connecting to one check node is referred to as a check node degree. The BER performance of the belief propagation decoding for LDPC codes highly depends on the degree distribution. For example, a rate-½ regular LDPC code having a variable node degree of 5 and a check node degree of 10 for all nodes performs poorly in general. In order to achieve the best possible performance, the degree distribution for irregular LDPC codes is designed by the EXIT trajectory analysis, wherein the finite number of decoding iterations is taken into account by a trajectory of mutual information updates over iterations.

FIG. 5 is a table of a non-limiting example of the degree distribution designed for the iteration-dependent AMC, as a function of iterations and code rates R, according to some embodiments of the invention. In FIG. 5, the optimized degree distributions of variable nodes for various code rates (R=½, ⅔, ¾, ⅘, and 9/10) and maximum number of iterations (2, 4, 8, 16, 32, and infinity) are present. This example considers check-concentrated LDPC codes, whose check node degrees are two consecutive integers. Therefore, the degree distribution of check nodes is automatically given by the variable degree distribution and the code rate. The degree distribution is represented by a polynomial function 501, e.g., as $0.21x^2+0.33x^3+0.46x^{12}$, which indicates that 21%, 33%, and 46% of edges are connected to variable nodes having degrees of 2, 3, and 12, respectively. The required SNR (RSNR) 502 can be improved when higher power consumption for more number of iterations is allowed. Note that the designed degree distribution depends on the code rates and the number of iterations. This embodiment of the invention using iteration-dependent PCM adaptation provides up to 2 dB gain compared to the conventional AMC, in which PCM does not depend on the number of iterations. In one embodiment, the AMC controller also depends on the number of demodulation iterations in addition to the number of decoding iterations for BICM-ID networks.

Adaptive LDPC Codes for High-Dimensional Modulations

In yet another embodiment of the invention, the PCM depends on the modulation format as well as the SNR value, the number of iterations for decoding, and the number of iterations for demodulation. This embodiment is based on a realization that one LDPC code designed for one modulation format does not perform well for another modulation format when BICM-ID is employed.

Figure 6:
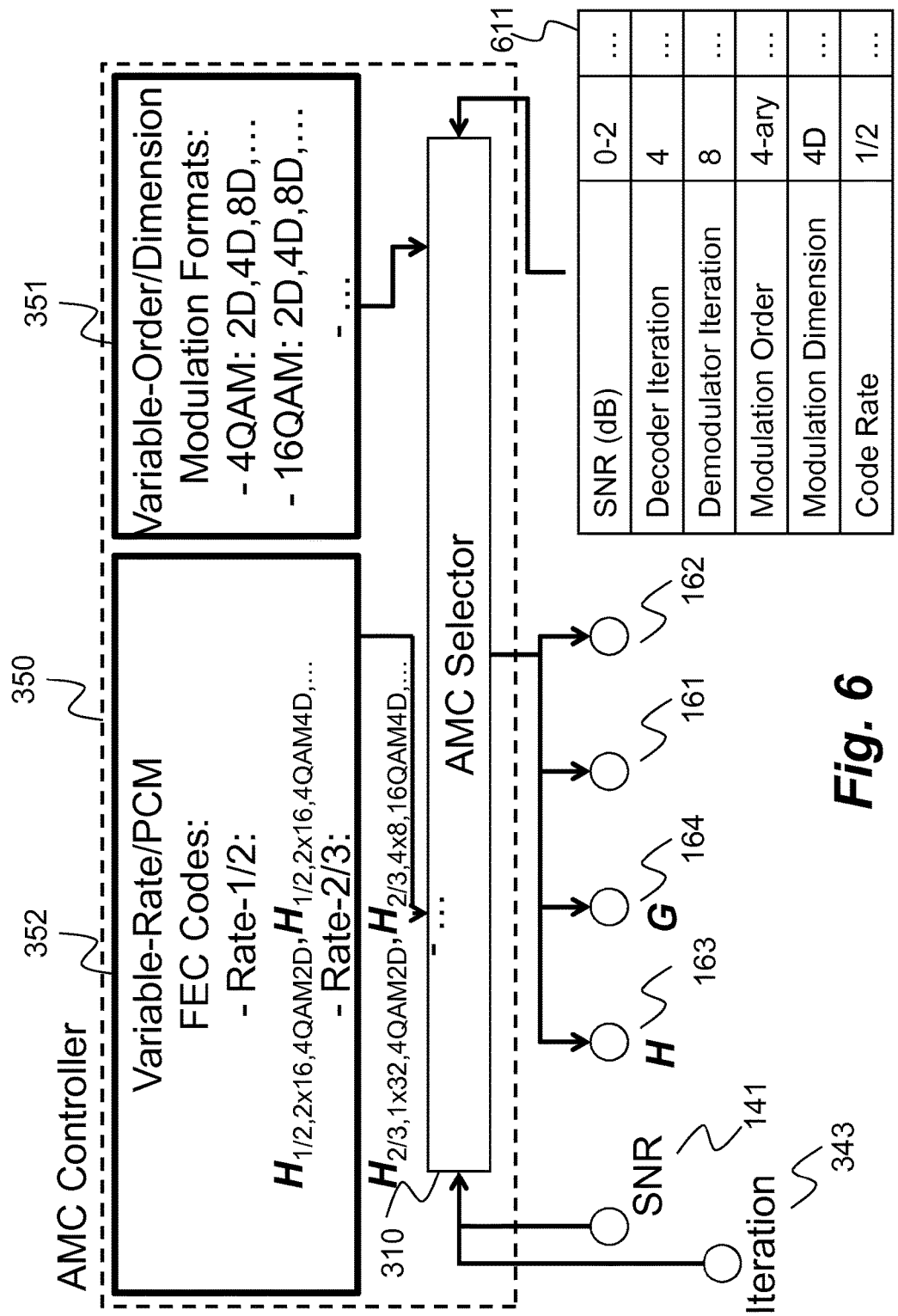
FIG. 6 is a block diagram of an AMC controller using modulation-dependent PCM adaptation according to some embodiments of the invention.

FIG. 6 shows the AMC controller using modulation-dependent PCM adaptation according to this embodiment of the invention. The AMC controller 350 uses a finite set of variable-order and variable-dimensional modulation formats 351, and a finite set of variable-rate and variable-PCM codes 352, wherein there are a large number of different PCMs for each code rate. For example, a PCM denoted by $H_{R,m \times n, qQAMdD}$ is used for the case when the code rate is R, the number of decoding iterations is n, the number of demodulation iterations is m, the modulation order is q, and the modulation dimension is d. The AMC controller 350 selects the best combination of modulation order q, modulation dimension d, and code rate R according to a selection rule table 611, which depends on the SNR value, the number of decoding iterations n, and the number of demodulation iterations m. Given the selected combination, the corresponding PCM and generator matrix are provided to the receiver and the transmitter. By using different PCMs for different modulation formats, the best possible BER performance can be achieved especially for high-order and high-dimensional modulations.

FIG. 7 is a table of a non-limiting example of the degree distribution of check-concentrated LDPC codes designed for BPSK-alternative high-dimensional modulations (2D, 4D, 8D, 16D, and 24D), according to this embodiment of the invention. In this example, the degree distributions 702 of the PCMs for 16D modulation based on the Nordstrom-Robinson nonlinear code and for 24D modulation based on the extended Golay code are different from that for BPSK 2D modulation. By increasing the modulation dimension 701, the required SNR 703 can be significantly improved from 4.35 dB to 0.69 dB. This modulation-dependent AMC offers some gain (e.g., 0.3 dB gain for 24D modulation at a code rate of 9/10) from the conventional AMC, in which PCM is independent of the modulation format.

Parity-Check Matrix (PCM) Design

The embodiments of the invention use different PCMs for modulation- and iteration-dependent AMC networks. Multiple PCMs are designed for each parameter setup of q-QAM, d-dimension, n-iteration decoding, m-iteration demodulation, code rate R, and codeword length N.

Figure 8:
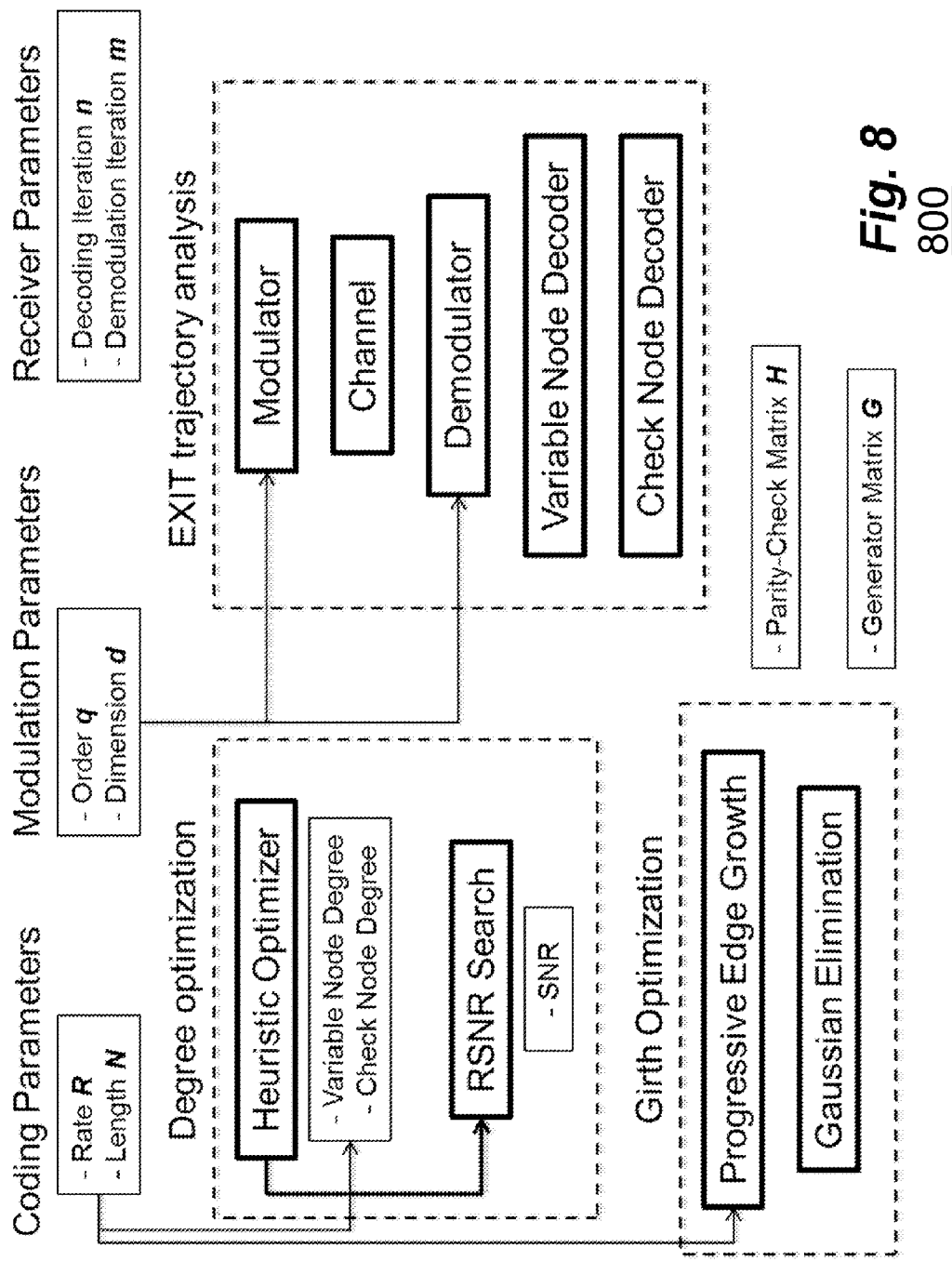
FIG. 8 is a schematic of PCM design using EXIT trajectory analysis for modulation-dependent and iteration-dependent AMC networks according to some embodiments of the invention.

FIG. 8 shows a schematic of PCM design according to some embodiments of the invention. This PCM design procedure is carried out either beforehand off-line or real-time on-line at the AMC controller 350, using some memory storages and computing processors. The PCM design method comprises a degree optimization 810, an EXIT trajectory analysis 820, and a girth optimization 830, given coding parameters (code rate R and length N) 801, modulation parameters (order q and dimension d) 802, and receiver parameters (decoding iteration n and demodulation iteration m) 803, to provide optimized PCM 832 and its corresponding generator matrix 836.

The degree optimization 810 uses a heuristic optimizer 811 to jointly optimize variable node degree distribution and check node degree distribution 812, in order to achieve the minimum possible required SNR, which is calculated by RSNR search 815. The degree distribution 812 is designed with the coding parameter 801, such that the average variable node degree $\bar{d}_v$ and average check node degree $\bar{d}_c$ are constrained as $R=1-\bar{d}_v/\bar{d}_c$. In practice, there is another constraint in the maximum degree (e.g., 16), which can determine the decoder throughput. The BER performance is usually improved by increasing the maximum degree, while the larger maximum degree can reduce the maximum decoder throughput. The heuristic optimizer 811 can use any optimization algorithms such as differential evolution, evolutionary strategy, genetic algorithm, simulated annealing, particle swarm optimization, Nelder-Mead, and quasi-Newton method, to minimize the required SNR. The RSNR search 815 can use any line search algorithms such as golden section search, bisection search, and Newton-Raphson method, to find the required SNR for the given degree distribution. The RSNR search 815 uses a tentative SNR value 816 to check if a finite-iteration decoder can decode the LDPC codes having the given degree distribution at the SNR value, by using the EXIT trajectory analysis 820. The SNR value 816 is chosen from a larger value than the theoretically minimum possible value determined by the Shannon limit of $q^R - 1$.

In order to take the finite-iteration decoder and high-dimensional modulation into account, the methods of the invention modify some principles of the EXIT chart analysis, derived by S. ten Brink, G. Kramer, and A. Ashikhmin in "Design of low-density parity-check codes for modulation and detection," IEEE Transactions on Communications, vol. 52, no. 4, April 2004. Rather than using EXIT curve fitting or linear programing, the embodiment uses the EXIT trajectory analysis 820 for practical decoders.

In this embodiment of the invention, the EXIT trajectory analysis 820 uses the SNR value 816 and the degree distribution 812 in addition to the modulation parameters 802 (which determine the modulation format) and the receiver parameters 803 (which determine the maximum number of iterations for decoding and demodulation), to calculate the mutual information after the finite-iteration decoding/demodulation for the given modulation format. The EXIT trajectory analysis 820 comprises a modulator 821, an emulated channel 822, a demodulator 823, a variable node decoder (VND) 824, and a check node decoder (CND) 825, with an iteration loop 826 from the CND to the VND and another iteration loop 827 from the CND to the demodulator. The demodulator loop 827 is iterated m times, and the decoder loop 826 is iterated n times every demodulator loop. The EXIT trajectory analysis uses Monte-Carlo simulations to generate many realizations of demodulator output by emulating the communications networks from the modulator 821 to the demodulator 823 through the virtual channel 822. The demodulator output is then statistically analyzed to calculate the mutual information. The modulator 821 and the demodulator 823 use the modulation parameters 802 to use the q-ary d-dimensional modulation format. The channel 822 uses the SNR value 816 to add random noise by a pseudo-random number generator from the white Gaussian distribution. Given the noisy channel output, the demodulator 823 generates log-likelihood ratio (LLR) output, with and without the decoder feedback 827. For high-order and high-dimensional modulations, each bit LLR can have different reliability, and the mutual information for each bit is calculated separately. For example, the most significant bit for 16 QAM has higher mutual information than the least significant bit. The mutual information is calculated by taking sample mean of the LLR values as $I_{DEM}=1-\mathbb{E}[1+\exp(-L)]$, where $I_{DEM}$ is the mutual information of the demodulator output, $\mathbb{E}[.]$ denotes the statistical sample mean, and L is the LLR value. The original random data transmitted from the modulator is used as a precoded coset leader, which adds zero codeword of the LDPC coding so that the encoding is not necessary for the mutual information analysis. For example, the LLR is algebraically inverted by the known transmitted data to emulate zero-word transmissions.

The calculated mutual information of the demodulator output are fed into the VND 824, where the mutual information is updated by another mutual information representing the belief propagation from the CND 825 from the previous iteration 826. The mutual information update is calculated as follows $$I_{VND}=J(\sqrt{(d_v-1)[J^{-1}(I_{CND})]^2+[J^{-1}(I_{DEM})]^2}),$$

where $d_v$ is the variable node degree, and $I_{CND}$ is the mutual information of the CND output. Here, the J-function is defined as $$J(s) = \begin{cases} a'_1 s^3 + b'_1 s^2 + c'_1 s, & 0 < s < s_0, \\ 1 - \exp(a'_2 s^3) + b'_2 s^2 + c'_2 s + d'_2, & s_0 < s < 10, \\ 1, & s > 10 \end{cases}$$

where $a'_1=-0.0421061$, $b'_1=0.209252$, $c'_1=-0.00640081$, $a'_2=0.00181491$, $b'_2=-0.142675$, $c'_2=-0.0822054$, $d'_2=0.0549608$, and $s_0=1.6363$. And, the inverse-J function is defined as $$J^{-1}(I) = \begin{cases} a_1 I^2 + b_1 I + c_1 \sqrt{I}, & 0 < I < I_0, \\ -a_2 \ln b_2(1-I) - c_2 I, & I_0 < I < 1 \end{cases},$$

where $a_1=1.09542$, $b_1=0.214217$, $c_1=2.33727$, $a_2=0.706692$, $b_2=0.386013$, $c_2=-1.75017$, and $I_0=0.3646$. According to the variable node degree distribution 812, the updated mutual information are averaged and submitted to the CND 825.

At the CND 825, the averaged mutual information are updated for each degree-$d_c$ check nodes as follows $$I_{CND}=1-J(\sqrt{(d_c-1)[J^{-1}(1-I_{VND})]^2}).$$

According to the check node degree distribution 812, the updated mutual information are averaged, and submitted back to the VND 824.

After n iterations of the decoding loop 826, the extrinsic mutual information from the decoder are fed back to the demodulator 823 through the demodulator loop 827. The extrinsic mutual information are expressed as $$I_{EXT}=J(\sqrt{d_v[J^{-1}(I_{CND})]^2}).$$

With the extrinsic mutual information, the demodulator 823 updates the LLR by feeding the corresponding a priori belief messages, generated by a pseudo-random number generator from the Gaussian distribution with a standard deviation of $J^{-1}(I_{EXT})$. The demodulator output is analyzed to calculate the mutual information of the updated LLR subtracted by the extrinsic mutual information. The updated mutual information from the demodulator 823 are then submitted to the VND 824. The demodulator iteration loop 827 is iterated m times, and the above mutual information updates are iterated mn times in total over the n-iteration decoding and the m-iteration demodulation.

After all mutual information updates are done, the mutual information of the a posteriori probability is calculated as $$I_{APP}=J(\sqrt{d_v[J^{-1}(I_{CND})]^2+[J^{-1}(I_{DEM})]^2}),$$

and the EXIT trajectory analysis 820 provides the mutual information of the a posteriori probability to the RSNR search 815. The RSNR search 815 uses the line search algorithm to find the minimum possible SNR, at which the EXIT trajectory analysis gives the mutual information achieving 1 (within a certain numerical precision).

The degree optimization 810 submits the optimized degree distribution 812 to the girth optimization 830 to generate the PCM 832 according to the degree distribution. One embodiment of the invention uses a progressive edge growth (PEG), proposed by X.-Y. Hu, E. Eleftheriou, and D. M. Arnold in "Regular and irregular progressive edge-growth tanner graphs," IEEE Transactions on Information Theory, vol. 51, no. 1, pp. 386-396, Jan. 2005. The PEG uses a greedy design method to increase the girth of the sparse bipartite graph, according to the target degree distribution and the desired codeword length N of the coding parameters 801. The PEG generates one PCM H 832 of a size M×N, optimized for the given coding parameters 801, the modulation parameters 802, and the receiver parameters 803.

The corresponding generator matrix G 836 is computed, e.g., by the Gaussian elimination 835, to generate a systematic codeword. Because there is no unique reorientation to fulfill the orthogonal compliment pair of HG=0, any other different methods such as a block-diagonalization method may apply to calculate the generator matrix. The procedure in the PCM design method 800 is carried out for all possible combinations of the coding parameters 801, the modulation parameters 802, and the receiver parameters 803.

In one embodiment, the mutual information updates are done by considering the statistical deviation due to the finite codeword length and finite-precision computations. In this embodiment, the mutual information is updated by the J-function and the inverse J-function with a standard deviation loss. For example, the mutual information updates are modified as follows $$I_{VND}=J(\alpha\sqrt{(d_v-1)[J^{-1}(I_{CND})]^2+[J^{-1}(I_{DEM})]^2}),$$

where $\alpha\leq 1$ is a loss parameter, empirically modeled as a function of the codeword length N, the variable node degree $d_v$, the target SNR, the precision digits, and the input mutual information. This robust degree distribution design can provide better performance, especially for short LDPC codes.

In another embodiment, the PCM design method is modified to use nonbinary LDPC codes, whose PCM comprises $0,1,\ldots,Q-1$ for the Galois field or the Lie ring of alphabet size Q. This embodiment uses an expected ensemble average of the mutual information for the nonbinary belief messages, by using the nonbinary variant of EXIT chart analysis. The nonbinary EXIT chart analysis also uses the J-function assuming that the nonbinary LLR vector is modeled by a correlated Gaussian distribution. The covariance is written as $(I_{Q-1}+1_{Q-1}1_{Q-1}^T)s^2/2$, where s is the standard deviation, $I_{Q-1}$ is the identity matrix of size Q-1, $1_{Q-1}$ is the all-one vector of size Q-1, and the superscript of $[.]^T$ denotes the transpose. The nonbinary LDPC codes are particularly important because the BER performance is usually improved and the demodulation iteration can be avoided if the alphabet size holds $Q=q^{d/2}$, whereas the computational complexity increases linearly with Q for nonbinary belief propagation decoding based on fast Fourier transform Q-ary sum-product algorithm (FFT-QSPA).

In yet another embodiment, the heuristic optimizer jointly optimizes multi-objective functions, comprising not only the required SNR but also the decoder complexity and the encoder complexity. This embodiment is based on a realization that the computational complexity of the belief propagation decoding is a function of the degree distribution. For example, the computational complexity of the VND increases with the variable node degree, in particular for fixed-point precision implementation. Using multi-objective variants of differential evolution, evolutionary strategy, and genetic algorithm, the heuristic optimizer searches for the best degree distribution 812 to provide a set of Pareto optimal solutions, which achieve, for example, the minimum possible required SNR and the minimum possible decoding complexity at the same time. For example, because the mutual information depends on a labeling for high-order and high-dimensional modulation if $Q\neq q^{d/2}$, the modulator 821 also uses a labeling table provided by the heuristic optimizer 811 to optimize the labeling together with the degree distribution.

Parity-Check Matrix (PCM) Design for Dynamic Window Decoding of QC-LDPC Convolutional Codes In one embodiment, the mutual information updates are tracked over all variable nodes and check nodes having different connectivity, characterized by a protograph. This embodiment uses a protograph-based EXIT chart analysis, which can provide more accurate performance prediction by using edge connection knowledge. For example, the check node degree is averaged not only by the degree distribution but also by all possible pairs derived by multi-nominal distribution. This embodiment is useful for high-order and high-dimensional modulation to take different LLR reliabilities into account.

For protograph-based LDPC codes, the PCM design can avoid using the PEG by considering quasi-cyclic (QC) LDPC codes, which are preferred for low-complexity encoding in some applications. In addition to the low-complexity encoding of QC-LDPC codes, the decoding can be simplified by using a dynamic window decoding for the case when the protograph is structured as a spatially-coupled convolutional coding. In some embodiments of the invention, the PCM design considers the protograph-based QC- LDPC convolutional codes for the dynamic window decoding. The dynamic window decoding performs well, while the decoding latency can be adjusted by a window size. This is particularly important for some modern communications applications, which are latency critical, e.g., machine-to-machine communications and optical interconnects.

Figure 9:
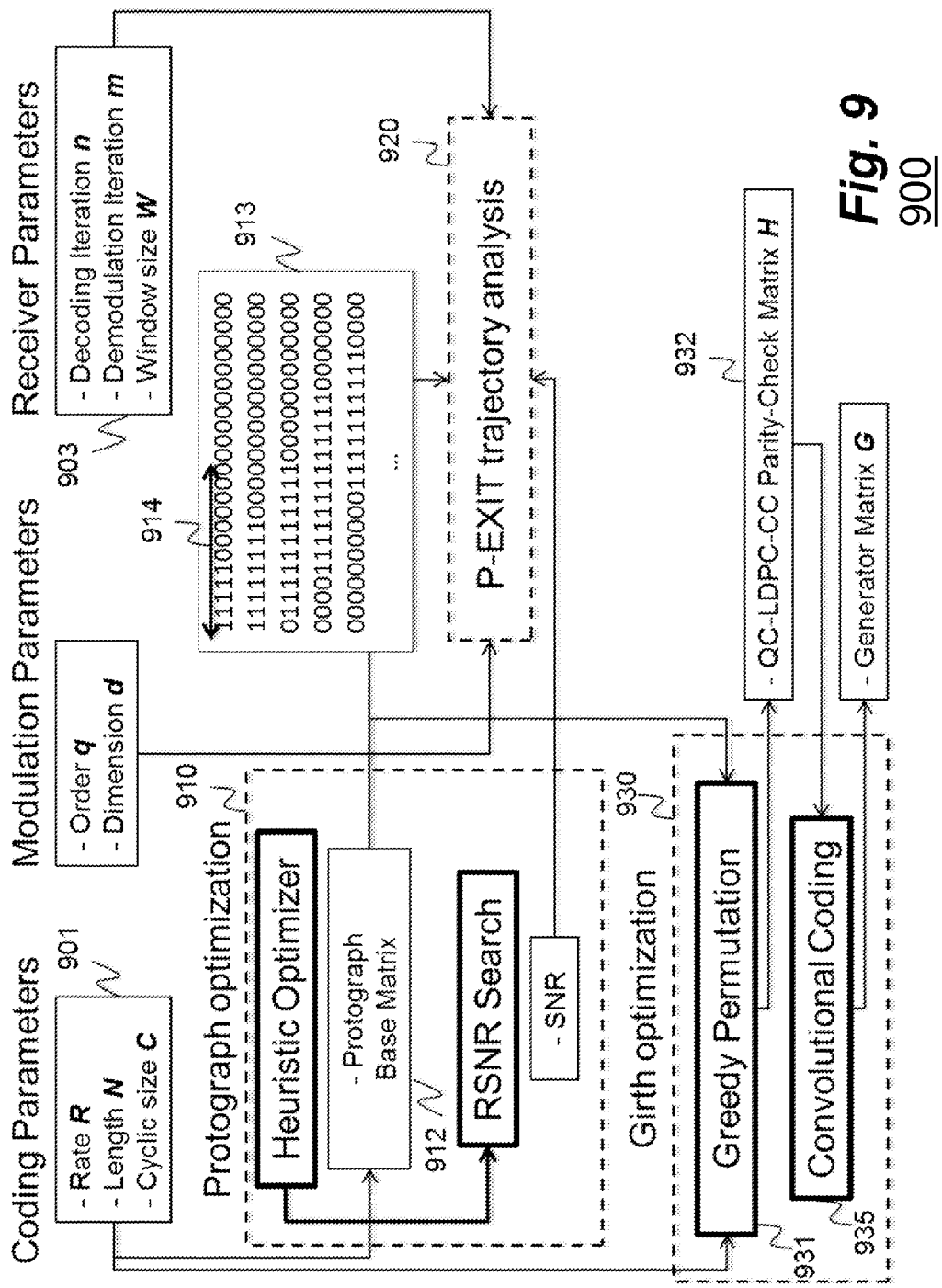
FIG. 9 is a schematic of PCM design using protograph-based EXIT trajectory analysis for quasi-cyclic LDPC convolutional codes according to some embodiments of the invention.

FIG. 9 shows the schematic of the PCM design for QC-LDPC convolutional codes according to these embodiments of the invention. The design method uses the coding parameters 901, the modulation parameters 802, and the receiver parameters 903. The coding parameters 901 comprises a QC matrix size C (e.g., C=256) as well as the code rate R and the length N. In this embodiment, the degree optimization 810 is not directly performed, while the protograph optimization 910 is carried out. The protograph optimization 910 uses the heuristic optimization 811 to design a protograph base matrix B 912. The protograph base matrix B is a size of M/C-by-N/C, which determines the block-wise connectivity of QC-LDPC codes. For QC-LDPC convolutional codes, the protograph base matrix is structured as a band matrix, in which non-zero entries are confined to a diagonal band 913. This band matrix structure enables low-complexity encoding and low-latency decoding. Rather than using regular QC-LDPC convolutional codes, whose variable node degree is constant over all variable nodes, the heuristic optimizer 811 searches for the best irregular band matrix, e.g., by using simulated annealing, genetic algorithm, and differential evolution, in terms of the minimum possible required SNR. The RSNR search 815 finds the required SNR by using a protograph-based EXIT (P-EXIT) trajectory analysis 920, which tracks the mutual information updates for all the variable nodes and check nodes in the protograph base matrix. Here, the P-EXIT trajectory analysis uses Monte-Carlo mutual information analysis according to the protograph base matrix, given the receiver parameters 903, which comprise the window size W as well as the decoding iteration n and the demodulation iteration m. The window size W 914 determines how many consecutive variable nodes propagate belief messages at once in the dynamic window decoding. The band matrix allows a relatively small window size without large performance degradation while the decoding latency can be significantly decreased.

Once the protograph optimization is done, the optimized protograph base matrix is submitted to a girth optimization 930. For QC-LDPC codes, the girth optimization is done by using a greedy permutation 931 instead of using the PEG 831. This embodiment uses some principles of the girth optimization described in US 20130086456 A1. The greedy permutation 931 sequentially searches for the minimum cycle in the protograph base matrix by an algebraic computation check, and modifies the exponent of the cyclic matrix. As a non-limiting example, the cyclic matrix of size C×C is defined as $$C_C = \begin{bmatrix} 0 & 1 & 0 & 0 \\ 0 & 0 & \ddots & 0 \\ 0 & 0 & 0 & 1 \\ 1 & 0 & 0 & 0 \end{bmatrix}.$$

In the end, the optimized PCM 932 is obtained for QC-LDPC convolutional codes. The corresponding generator matrix G is provided by a convolutional coding structure 935, which creates multiple generator matrices for sub matrices in the PCM for convolutional encoding.

Adaptive Receivers Using Few Number of Generator Matrices

To support all possible combinations of the coding parameters (the code rate R, the length N, and the QC size C), the modulation parameters (order q and dimension d) and the receiver parameters (the decoding iteration n, the demodulator iteration m, and the window size W), the AMC scheme according to the embodiments in FIG. 6 requires to provide a large number of pairs for generator matrices and PCMs. For example, when the receiver parameters comprise all combinations of m∈{1,2,4,8,16,32}, n∈{1,2,4,8,16,32}, and W∈{10,20,40,80,160,320}, the total number of combinations becomes $6^3=216$ for every code rate and every modulation format. Some embodiments of the invention solve this problem by reducing the required number of generator matrices. This embodiment is based on a realization that the orthogonal pair of the generator matrix G and the PCM H is not uniquely defined. This suggests that a lot of linearly dependent PCMs can be generated for one generator matrix. This embodiment is also based on a realization that the decoding performance is dependent on the degree distribution of PCMs, whereas the generator matrix does not directly determine the BER performance but encoder complexity.

Figure 10:
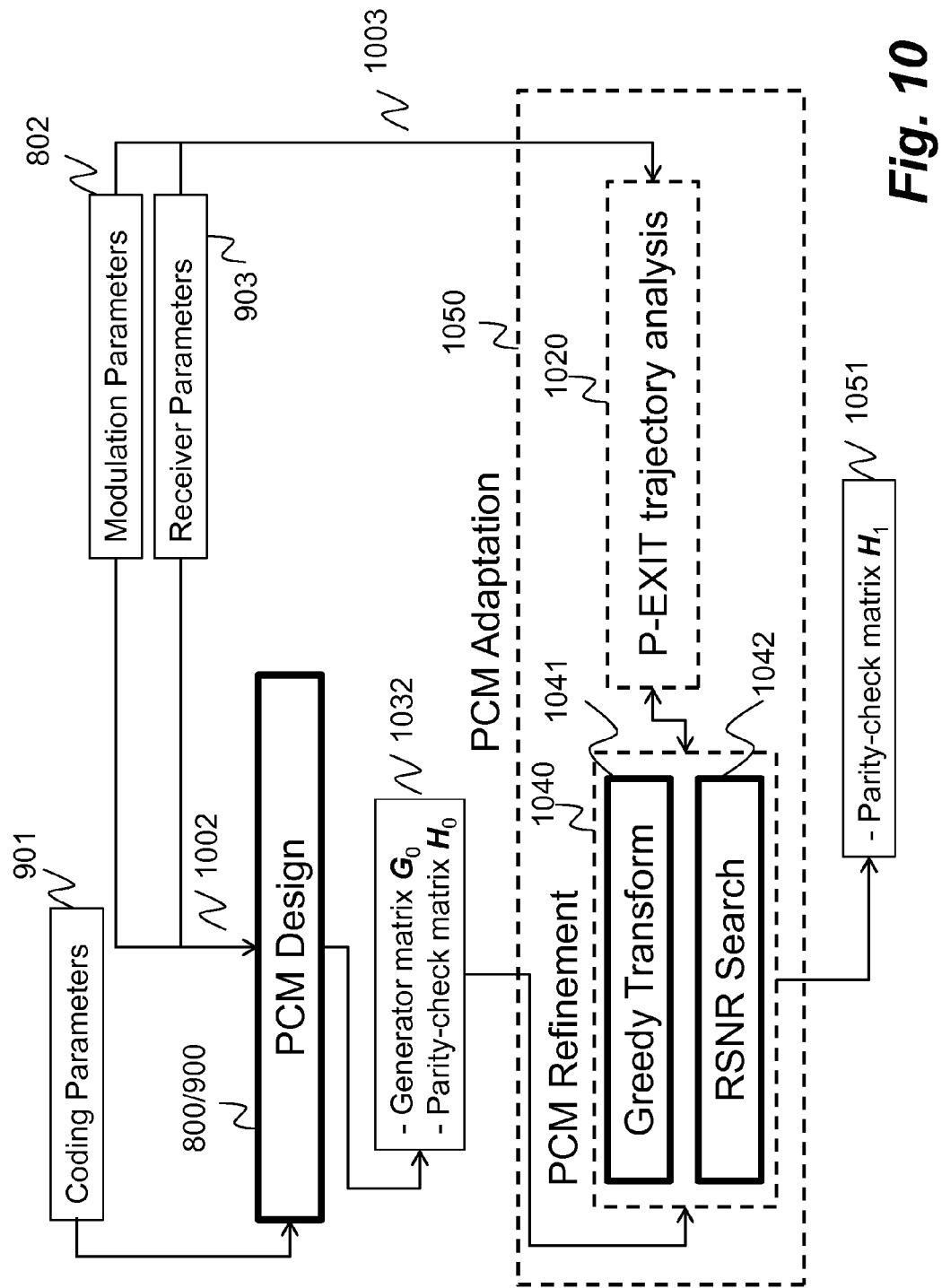
FIG. 10 is a schematic of PCM design for a common generator matrix to support a large number of parameter combinations according to some embodiments of the invention.

FIG. 10 shows the schematic of the PCM design method according to this embodiment of the invention. In this embodiment, an initial generator matrix $G_0$ and an initial PCM $H_0$ are first optimized by the PCM design method 800 in FIG. 8 or the PCM design method 900 in FIG. 9. The initial matrices 1032 are designed for one combination 1002 of the modulation parameters 802 and the receiver parameters 903, for a coding parameter 901. For example, the PCM design begins one typical set of parameters, e.g., q=4, d=2, n=16, and m=1. The designed PCM $H_0$ works only for this set of parameters. This embodiment uses the common generator matrix $G_0$ regardless of the modulation parameters and the receiver parameters, so that the number of required generator matrices are reduced for the transmitter in the AMC networks. For example, when the receiver changes the number of iterations for decoding, the AMC network keeps using the same generator matrix, while the different PCM is adaptively selected to be optimal for the receiver.

The PCM adaptation 1050 then modifies the initial PCM $H_0$ to be optimal for the different combinations 1003 of the modulation parameters and the receiver parameters. For example, the modified PCM $H_1$ 1051 is optimized for fewer-iteration decoder, e.g., q=4, d=2, n=4, and m=1. The optimized PCM $H_1$ 1051 has a different degree distribution from the initial PCM $H_0$, while it is still orthogonal to the initial generator matrix $G_0$ such that $H_1 G_0 = 0$ over the Galois field or the Lie ring. At the PCM adaptation 1050, the PCM refinement 1040 searches for the best PCM, which is linearly transformed at a greedy transform 1041, to achieve the minimum possible required SNR 1042 via the protograph-based EXIT trajectory analysis 1020. The greedy transform 1041 adds one randomly selected row to another randomly selected row of the PCM. The random selection is prioritized for a pair of rows, which has a higher correlation so that the PCM does not rapidly increase the number of non-zero elements. For each linear-transformed PCM, the required SNR is determined by the EXIT trajectory analysis 1020, which uses the considered combinations 1003 of the modulation parameters and the receiver parameters. After several iterations of the random linear transforms, the best PCM $H_1$ to provide the minimum required SNR is obtained.

The PCM adaptation 1050 is performed for all different combinations of the modulation parameters 802 and the receiver parameters 903. In the end, multiple PCMs ($H_0$, $H_1$, . . . ) having different degree distributions are designed for various different parameters, while the transmitter can keep using only one generator matrix $G_0$ for each code rate.

One embodiment can use a regular LDPC code for encoder, while the re-designed irregular PCM, which is orthogonal to the regular LDPC generator matrix, can be used for better decoding performance. In another embodiment, a fast-encodable LDPC codes such as bi-diagonal LDPC codes or QC-LDPC codes are used at the transmitter, while the receiver uses the re-optimized PCM, which is linearly dependent on the original PCM, to achieve better BER performance.

Parity-Check Matrix (PCM) Adaptation Over Iteration

Based on the realization that multiple PCMs having different degree distribution can be designed for one common generator matrix, another embodiment of the invention uses more dynamic PCM adaptation across decoding iterations. This embodiment can improve the convergence speed for mutual information updates over the belief propagation decoding, and can mitigate a BER error floor problem by removing the cycle over the bipartite graph. In the previous embodiments, the best PCM designed for a finite-iteration decoder does not change over the iteration count. For example, one PCM $H_{1/2,32}$ is used for the code rate ½ and for 32-iteration decoding over all iteration counts from the $1^{st}$ iteration to the $32^{nd}$ iteration. In this embodiment of the invention, multiple different PCMs $H_{1/2,32[1]}$, $H_{1/2,32[2]}$, . . . , $H_{1/2,32[32]}$ are designed for the 32-iteration decoding, wherein the i-th PCM $H_{1/2,32[i]}$ achieves the best performance at the i-th iteration to maximize the mutual information.

This embodiment is related to adaptive belief propagation (ABP), while the PCM adaptation across the iteration count is pre-defined unlike the ABP. The method of this embodiment can remove a fundamental problem of minimal cycles over a bipartite graph, which can cause a BER error floor, by changing directly the bipartite graph over iteration. In addition to the error floor mitigation, this embodiment can improve the convergence speed of belief propagation decoding because the best PCM can be designed to have specific degree distribution in order to maximize the mutual information for every iteration count.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

I claim:

1. A method for adaptive modulation and coding (AMC) in a communications network, comprising steps:
coding and decoding data using a set of codes having variable rate and multiple variable parity-check matrices (PCMs); and
modulating and demodulating the data using a set of modulation formats having variable order and variable dimension, wherein the coding and the modulating are performed in a transmitter and the demodulating and the decoding are performed in a receiver,
wherein the decoding uses a set of low-density parity-check (LDPC) codes having variable rate and variable PCM, wherein multiple PCMs have different degree distributions to achieve a minimum required SNR designed for different modulation parameters, different receiver parameters, and different coding parameters,
wherein designing the multiple PCMs comprises steps;
adjusting a degree distribution for variable nodes and check nodes in a bipartite graph for a given combination of the coding parameters, the modulation parameters, and the receiver parameters;
adjusting a girth according to the adjusted degree distribution; and
adapting the PCM to refine for different combinations of the modulation parameters and the receiver parameters,
wherein adjusting the degree distribution comprises steps;
setting up the degree distribution with average and maximum degree constraints;
modifying a bit labeling for a high-order and high-dimensional modulation;
analyzing mutual information updates across decoding iterations given the degree distribution by using an extrinsic information transfer (EXIT) trajectory analysis;
searching for a required SNR achieving the mutual information of one by using a line search algorithm;
iterating from the setting to the searching steps using heuristic optimization methods until a maximum iteration of optimizations reaches a pre-defined number; and
outputting the degree distribution and the required SNR.

2. The method of claim 1, further comprising a step:
selecting a combination of one of the codes and one of the modulation formats, depending on a signal-to-noise ratio (SNR) and iteration counts for the demodulating and the decoding, according to a network requirement of power consumption, latency, bit error rate (BER), data rate, and complexity of the coding, modulating, demodulating and decoding.

3. The method of claim 1, further comprising steps:
encoding the data using a selected generator matrix to produce encoded data;
modulating the encoded data using the selected modulation format to produce modulated data;
transmitting the modulated data from the transmitter to the receiver over a channel;
receiving output of the channel as noisy data;
demodulating the noisy data using a soft-input soft-output maximum a posterirori probability (MAP) algorithm to calculate a log-likelihood ratio (LLR) to produce demodulated data; and
decoding the demodulated data using a selected PCM, wherein a number of decoding iterations and a number of demodulating iterations are variable.

4. The method of claim 1, wherein the decoding uses a series of multiple PCMs for different iteration counts, wherein the i-th PCM has a different degree distribution designed for the i-th decoding iteration, wherein one or more of the multiple PCMs are linearly dependent and orthogonal to one common generator matrix used at the transmitter.

5. The method of claim 1, wherein the degree distribution is obtained by a protograph base matrix, in which non-zero elements are confined in a band diagonal matrix so that quasi-cyclic (QC) LDPC convolutional code is designed for low-complexity encoding and low-latency decoding with a dynamic window decoding, wherein QC-LDPC codes use a Galois field or a Lie ring.

6. The method of claim 1, wherein heuristic optimization methods use a multi-objective function to search for a set of Pareto optimal solutions, wherein the multi-objective function comprises joint minimizations of the required SNR, BER, encoding complexity, decoding complexity, average degree, maximum degree, decoding latency, and circuit size, by using a multi-objective variant of differential evolution, evolutionary strategy, simulated annealing, genetic algorithm, or swarm optimization.

7. The method of claim 1, wherein adjusting the girth comprises steps;
generating the PCM having an optimized degree distribution by using a progressive edge growth (PEG) or a greedy linear transform;
calculating a corresponding generator matrix by using a Gaussian elimination of the optimized PCM; and
outputting the optimized PCM and generator matrix.

8. The method of claim 1, wherein the EXIT trajectory analysis comprises steps:
emulating the communications network for a target SNR via Monte-Carlo runs;
calculating LLR via the MAP algorithm, wherein the LLR is algebraically inverted by a precoded coset leader; and
analyzing mutual information updates across iterations for finite-iteration decoding and demodulating.

9. The method of claim 8, wherein the mutual information updates account for a standard deviation loss due to finite-precision computations and finite-length codes, wherein the standard deviation loss is empirically modeled as a function of input mutual information, a variable node degree, a check node degree, a code length, and precision digits through Monte-Carlo runs.

10. The method of claim 1, wherein the PCM is variable depending on the modulation formats.

11. The method of claim 1, wherein the set of modulation formats have different orders and different dimensions, further comprising;
block-coded high-dimensional modulations, comprising 4-dimensional (4D) simplex modulation, 8D modulation based on an extended Hamming code, 16D modulation based on a Nordstrom-Robinson nonlinear code, and 24D modulation based on an extended Golay code;
sphere-cut lattice-packed modulations, comprising 4D checker board lattice, 6D diamond lattice, 12D Coxeter-Todd lattice, 16D Barnes-Wall lattice, and 24D Leech lattice;
space-time modulations, comprising Cayley-transformed unitary modulation, Alamouti modulation, and Reed-Muller operator modulation; and
quadrature-amplitude modulations (QAM), comprising phase shift keying (PSK), and pulse-amplitude modulation (PAM).

12. An adaptive modulation and coding (AMC) controller, comprising:
a memory storing
a set of codes having variable rate and multiple variable PCMs for encoding and decoding data; and
a set of modulation formats having variable order and variable dimension for modulating and demodulating the data, wherein the set of modulation formats have different orders and different dimensions, further comprising;
block-coded high-dimensional modulations, comprising 4-dimensional (4D) simplex modulation, 8D modulation based on an extended Hamming code, 16D modulation based on a Nordstrom-Robinson nonlinear code, and 24D modulation based on an extended Golay code;
sphere-cut lattice-packed modulations, comprising 4D checker board lattice, 6D diamond lattice, 12D Coxeter-Todd lattice, 16D Barnes-Wall lattice, and 24D Leech lattice;
space-time modulations, comprising Cayley-transformed unitary modulation, Alamouti modulation, and Reed-Muller operator modulation; and
quadrature-amplitude modulations (QAM), comprising phase shift keying (PSK), and pulse-amplitude modulation (PAM); and
an AMC selector for selecting a combination of one of the codes and one of the modulation formats for coding and modulating in a transmitter, and demodulation and decoding in a receiver.

13. The adaptive modulation and coding (AMC) controller of claim 12, wherein the decoding uses a set of low-density parity-check (LDPC) codes having variable rate and variable PCM, wherein multiple PCMs have different degree distributions to achieve a minimum required SNR designed for different modulation parameters, different receiver parameters, and different coding parameters.

14. The adaptive modulation and coding (AMC) controller of claim 12, wherein the decoding uses a series of multiple PCMs for different iteration counts, wherein the i-th PCM has a different degree distribution designed for the i-th decoding iteration, wherein one or more of the multiple PCMs are linearly dependent and orthogonal to one common generator matrix used at the transmitter.

15. A method for adaptive modulation and coding (AMC) in a communications network, comprising steps:
coding and decoding data using a set of codes having variable rate and multiple variable parity-check matrices (PCMs); and
modulating and demodulating the data using a set of modulation formats having variable order and variable dimension, wherein the coding and the modulating are performed in a transmitter and the demodulating and the decoding are performed in a receiver,
wherein the set of modulation formats have different orders and different dimensions, further comprising;
block-coded high-dimensional modulations, comprising 4-dimensional (4D) simplex modulation, 8D modulation based on an extended Hamming code, 16D modulation based on a Nordstrom-Robinson nonlinear code, and 24D modulation based on an extended Golay code;
sphere-cut lattice-packed modulations, comprising 4D checker board lattice, 6D diamond lattice, 12D Coxeter-Todd lattice, 16D Barnes-Wall lattice, and 24D Leech lattice;
space-time modulations, comprising Cayley-transformed unitary modulation, Alamouti modulation, and Reed-Muller operator modulation; and
quadrature-amplitude modulations (QAM), comprising phase shift keying (PSK), and pulse-amplitude modulation (PAM).

* * * * *